United States Patent
Jo et al.

(10) Patent No.: US 8,686,633 B2
(45) Date of Patent: Apr. 1, 2014

(54) ORGANIC LIGHT EMITTING DISPLAY DEVICE AND METHOD FOR MANUFACTURING THE SAME

(71) Applicant: LG Display Co., Ltd., Seoul (KR)

(72) Inventors: Jung-Sik Jo, Gyeonggi-do (KR); So-Young Jo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/719,320

(22) Filed: Dec. 19, 2012

(65) Prior Publication Data

US 2013/0285540 A1    Oct. 31, 2013

(30) Foreign Application Priority Data

Apr. 30, 2012 (KR) .................. 10-2012-0045561

(51) Int. Cl.
*H01J 1/62* (2006.01)
*H05B 33/00* (2006.01)

(52) U.S. Cl.
USPC ............................. 313/504; 313/506; 313/507

(58) Field of Classification Search
USPC ................................ 313/498–512; 257/98, 40
See application file for complete search history.

(56) References Cited

U.S. PATENT DOCUMENTS

| 8,298,032 B2* | 10/2012 | Potts et al. ..................... 445/24 |
| 2004/0012328 A1* | 1/2004 | Arnold et al. ................. 313/504 |
| 2006/0175961 A1* | 8/2006 | Choong ........................ 313/506 |
| 2006/0186806 A1* | 8/2006 | Utsumi et al. ................ 313/506 |
| 2009/0066241 A1* | 3/2009 | Yokoyama .................... 313/504 |

FOREIGN PATENT DOCUMENTS

| JP | 09-069642 | 3/1997 |
| KR | 10-2001-0067152 A | 7/2001 |
| KR | 10-2003-0029467 A | 4/2003 |

\* cited by examiner

*Primary Examiner* — Tracie Y Green
(74) *Attorney, Agent, or Firm* — Morgan, Lewis & Bockius LLP

(57) ABSTRACT

An organic light emitting display device (OLED) includes: a substrate; a first anode layer disposed on the substrate and including a plurality of first projections; a second anode layer formed on the first anode layer and including a plurality of second projections; an organic emission layer formed on the second anode layer; and a cathode layer formed on the organic emission layer. As a result, the anodes are formed to have a double projection structure to enhance light extraction efficiency.

20 Claims, 8 Drawing Sheets

ORGANIC LIGHT EMITTING DISPLAY DEVICE AND METHOD FOR MANUFACTURING THE SAME

The present application claims the priority benefit of Korean Patent Application No. 10-2012-0045561 filed in Republic of Korea on Apr. 30, 2012, which is hereby incorporated by reference in its entirety.

BACKGROUND

1. Field of the Disclosure

The present disclosure relates to an organic light emitting display device (OLED) and a method of fabricating the same, and more particularly, to an OLED whose light extraction efficiency is improved and a method of fabricating the same.

2. Discussion of the Related Art

Following a liquid crystal display, an organic light emitting display device (OLED) characterized by thin thickness, high definition and driving at low power has been drawing an increasing amount of attention as a next-generation display. Reflecting such a current trend, research aimed at mass production of OLEDs has been extensively underway.

In particular, in order to enhance a device, new emission materials have been developed, and a multiple-layered structure for facilitating provision of electrons or holes has been researched. In addition, a technique enhancing efficiency of extracting internally generated light to the outside of a device has been developed.

Currently, light that is not outwardly extracted by total internal reflection in the OLED but blocked takes up 70% or more of the total emission amount, and if this light is outwardly extracted, light efficiency of the OLED may be significantly improved.

FIG. 1 is a cross-sectional view of a general OLED, and illustrates a bottom emission type in which light penetrates in a direction of a substrate 110. According to FIG. 1, the OLED has a structure in which an anode layer 120 formed of indium tin oxide (ITO) and/or indium zinc oxide (IZO), an organic emission layer 130 and a cathode layer 140 formed of a metal, are sequentially stacked on the substrate 110.

Light emitted from the organic emission layer 130 exhibits total reflection on a boundary between the anode layer 120 and the substrate 110. Here, in principal, an amount of the first loss of the light takes up 46% or more of the total emission amount. Also, among the remaining 54% of penetrating light, an amount of a second loss of the light that is totally reflected on the boundary between the substrate 110 and air is 34% or more in principal. Therefore, the light extracted outside of the substrate 110 is 20% or less of an emission rate of light emitted from the organic emission layer 130.

The OLED is formed as an ultra-thin film, and emitted light should penetrate the thin film to be outwardly emitted, so that significant light loss may be caused by the total reflection. When these problems are overcome, the OLED may be more efficiently implemented.

SUMMARY

Accordingly, the present invention relates to an organic light emitting display device (OLED) in which anodes formed on a substrate are formed to have a double projection structure to improve light extraction efficiency.

one object of the present disclosure is to provide an OLED having a substrate; a first anode layer disposed on the substrate and including a plurality of first projections; a second anode layer formed on the first anode layer and including a plurality of second projections; an organic emission layer formed on the second anode layer; and a cathode layer formed on the organic emission layer.

Another object of the present disclosure is to provide a method of fabricating an OLED, including forming a first anode layer including a plurality of first projections on a substrate; forming a second anode layer including a plurality of second projections on the first anode layer; forming an organic emission layer on the second anode layer; and forming a cathode layer on the organic emission layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention. In the drawings.

DETAILED DESCRIPTION OF THE PREFERRED EMBODIMENTS

Reference will be made in detail to the exemplary embodiments, examples of which are illustrated in the accompanying drawings.

Figure 1:
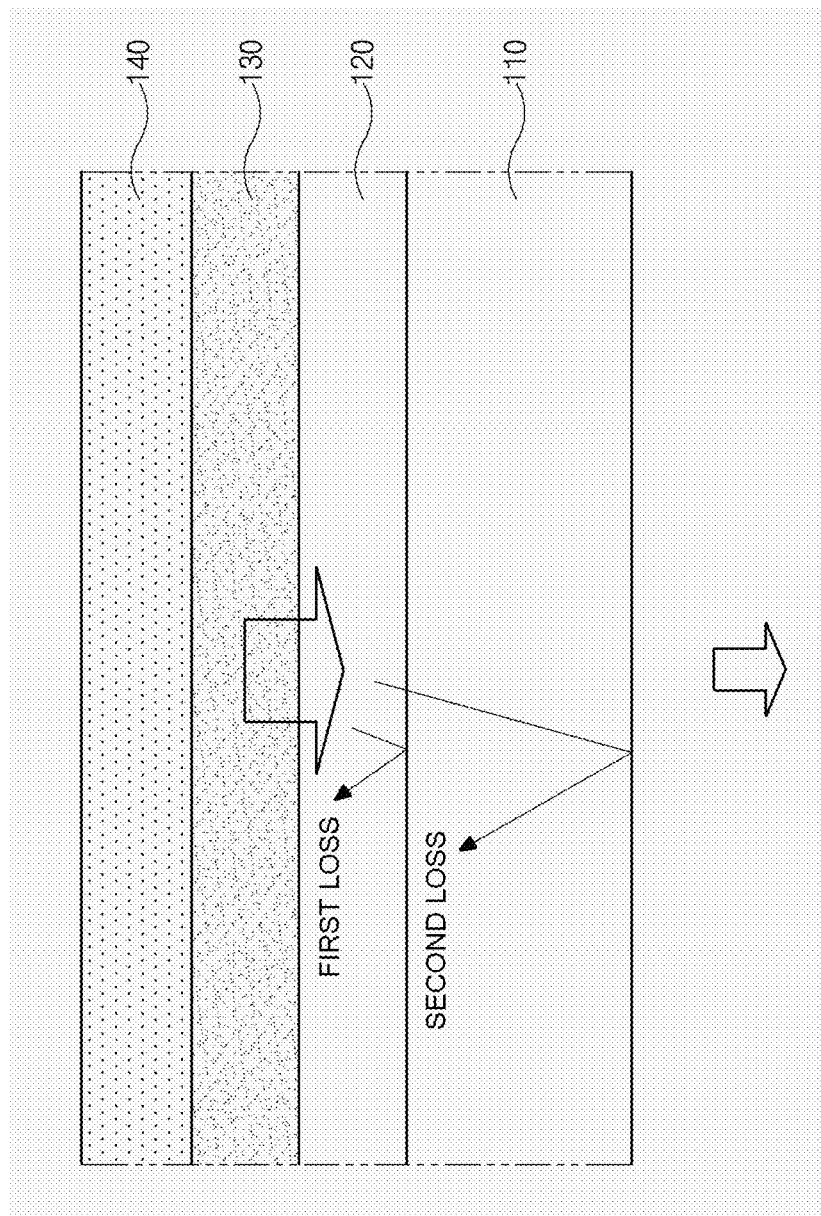
FIG. 1 is a cross-sectional view of a general organic light emitting display device (OLED)
Figure 2:
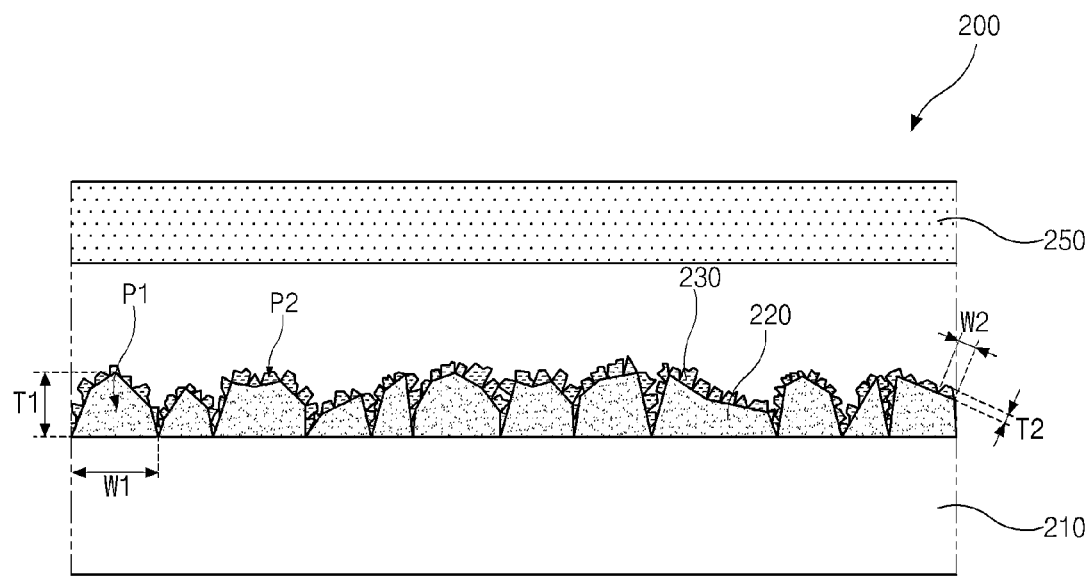
FIG. 2 is a cross-sectional view of an organic light emitting display device (OLED) according to some embodiments of the present invention.

FIG. 2 is a cross-sectional view of an organic light emitting display device (OLED) according to some embodiments of the present invention. As illustrated in FIG. 2, the OLED 200 according to some embodiments of the present invention includes a substrate 210, a first anode layer 220, a second anode layer 230, an organic emission layer 240 and a cathode layer 250.

First and second projections P1 and P2 may be formed on the first and second anode layers 220 and 230 formed on the substrate 210, so that a total reflection phenomenon is reduced and light extraction efficiency is improved. The projections P1 and P2 may be formed by crystalline particles generated by gradually hardening a material constituting the first and second anode layers 220 and 230 formed by sputtering. The size of the crystalline particles is different depending on a material, and the first and second anode layers 220 and 230 may be formed of different materials, and thus widths W1 and W2 of the projections P1 and P2 are differently formed.

The widths W1 and W2 used herein denote the lengths in a horizontal direction of bottoms of the projections P1 and P2.

Meanwhile, the material constituting the first and second anode layers 220 and 230 may be determined by thicknesses T1 and T2 of the first and second anode layers 220 and 230 depending on a film forming amount of the material constituting the first and second anode layers 220 and 230. The thickness T1 of the first anode layer 220 as used herein denotes a length from a lowermost end to an uppermost end in a direction vertical to a surface in contact with a substrate 210, and the thickness T2 of the second anode layer 220 and 230 denotes a length from a lowermost end to an uppermost end in a direction vertical to a curved surface in contact with the first anode layer 220. For example, the second anode layer 230 exhibits a curve on the surface in contact with the first anode layer 220, and thus the vertical direction on which the thickness T2 is based may be varied. A difference between the thicknesses T1 and T2 of the first and second anode layers 220 and 230 and that between the widths W1 and W2 of the projections P1 and P2 may have a direct effect on light extraction efficiency, which is the basic principle of the present invention.

First, the substrate 210 may be formed of glass, or may include polyimide that is a bendable material.

The first anode layer 220 may be formed on the substrate 210. The first anode layer 220 may be formed of tin oxide or zinc oxide using a sputtering method. The first anode layer 220 may be formed to a thickness T1 from about 500 to about 2500 Å, from about 1000 to about 2000 Å, from about 1000 to about 2500 Å, or from about 1500 to about 2000 Å. A plurality of projections P1 formed on the first anode layer 220 may be formed to a width W1 from about 1000 to 5000 Å, from about 2000 to about 4000 Å, from about 2000 to about 5000 Å, or from about 3000 to 4000 Å. The first projection P1 may be in the shape of a pillar that is upwardly narrowed and sharp. The detailed shape may be varied. Therefore, the first projection P1 that is in the uniform shape in the drawing may be in various shapes.

In some embodiments, the anode layer of the OLED 200 may include a material (e.g. indium tin oxide, indium zinc oxide, and a mixture thereof) taking into account transmission rate, resistance and work function. Therefore, the second anode layer 230 may be formed of indium tin oxide and/or indium zinc oxide to employ a double projection structure capable of maintaining functions of the anode layer and having a smoother surface.

The second anode layer 230 may be formed on the first anode layer 220. The second anode layer 230 may be formed of indium tin oxide and/or indium zinc oxide using a sputtering method. The second anode layer 230 may be formed to a thickness T2 from about 5 to about 250 Å, from about 10 to about 200 Å, or from about 50 to about 100 Å, and the plurality of second projections P2 formed on the second anode layer 230 may be formed to a width W2 from about 10 to about 500 Å, from about 50 to about 400 Å, from about 100 to about 300 Å, or from about 200 to about 300 Å. Similar to the first projection P1, while the second projection P2 may be in the shape of a pillar that is gradually upwardly narrowed and sharp, its detailed shape may be varied. Therefore, while the second projection P2 is in a uniform shape in the drawing, the second projection P2 may have various shapes like the first projection P1.

Accordingly, the double projection structure of the anode layers 220 and 230 may cause many diffraction points of light, so that total reflection of the light at a boundary of the stacked structure may be further reduced.

In addition, when the second anode layer 230 may include indium tin oxide and/or indium zinc oxide, work function of the anode layers 220 and 230 may be improved, which may facilitate injection of holes into the organic emission layer 240.

The organic emission layer 240 may be formed on the second anode layer 230. The organic emission layer 240 may be formed of a multiple-layered structure in which several layers are stacked to help holes and electrons move as well as a layer that actually emits light. The organic emission layer 240 may emit light having energy as great as a band gap by flowing electrons provided from the cathode layer 250 from a conduction band to a valence band to be combined with holes provided from the anode layers 220 and 230.

Meanwhile, when the projection is large and has a sharp upper end, the organic emission layer 240 formed on the anode layers 220 and 230 may be divided and damaged, and the damage is mainly exhibited on a cusp of the uppermost end of the projection, i.e., a crack point. In the double projection structure of the present invention, since the width W2 of the second projection P2 may be from about 2 to about 500 times, from about 10 to about 100 times, from about 50 to about 300 times, or from about 100 to about 300 times smaller than the width W1 of the first projection P1, the second projection P2 may reduce the degree of sharpness of the first projection P1. Accordingly, the double projection structure may remove the crack point to prevent the organic emission layer 240 from being damaged.

The cathode layer 250 may be formed on the organic emission layer 240. Since the cathode layer 250 may comprise a material that exhibits high reflectance (e.g. silver (Ag) and aluminum (Al)) and may function as a reflection plate as well as an electrode.

Figure 3:
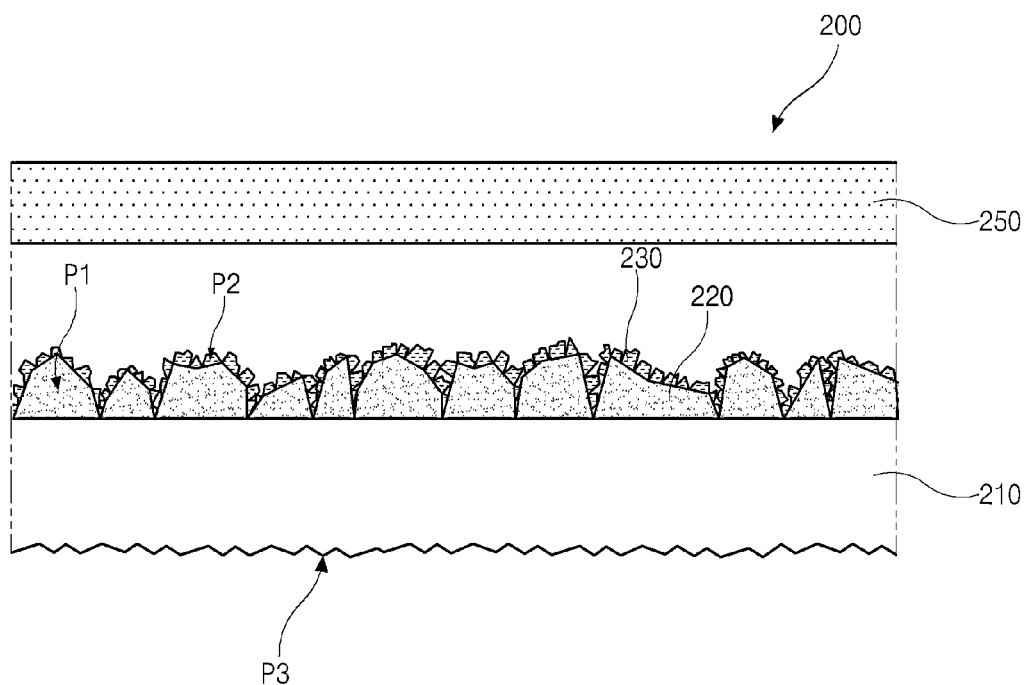
FIG. 3 is a cross-sectional view of an OLED according to additional embodiments of the present invention.

FIG. 3 is a cross-sectional view of an OLED according to a second embodiment of the present invention.

As illustrated in FIG. 3, an OLED 200 according to additional embodiments of the present invention includes a plurality of third projections P3 on the substrate 210. The substrate 210 has a refraction index of about 1.5, and the air has a refraction index of 1.0, and thus total reflection frequently may occur at a boundary between the substrate 210 and the outside. Similarly to the first and second projections P1 and P2, the third projection P3 may reduce the total reflection of light penetrating the first and second anode layers 220 and 230 at the boundary between the substrate 210, so that light extraction efficiency is increased.

Figure 4:
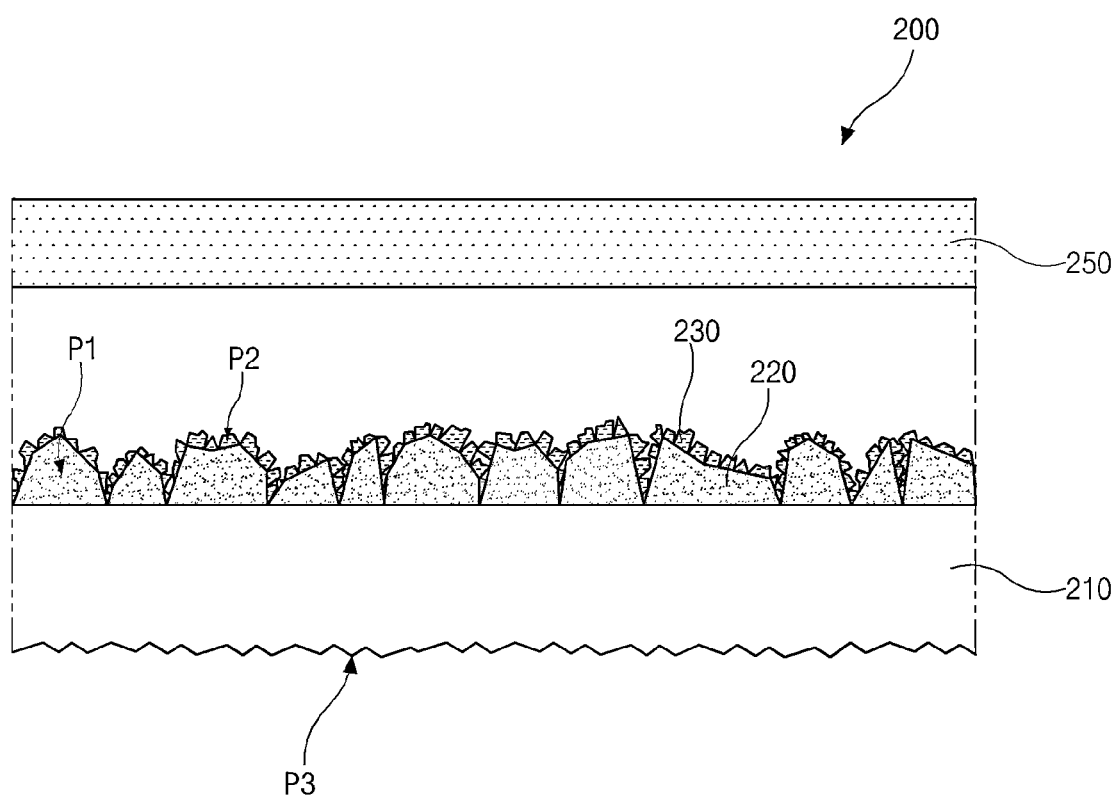
FIG. 4 is a cross-sectional view of an OLED according to yet additional embodiments of the present invention.

FIG. 4 is a cross-sectional view of an OLED according to some embodiments of the present invention.

As illustrated in FIG. 4, the OLED 200 according to some embodiments of the present invention includes a low refraction layer 260 between the substrate 210 and the first anode layer 220.

Since the low refraction layer 260 may be formed of a material exhibiting a different refraction index from the substrate, when light passing through the low refraction layer 260 travels toward the substrate 210, total reflection occurs less, so that light loss is reduced, and at the same time, linearity of light emitted from the substrate 210 may be improved.

In addition, when the linearity of light is improved, the total reflection of light emitted from the OLED 200 is reduced, so that light extraction efficiency is improved. As previously described, the substrate 210 according to some embodiments has a refraction index of about 1.5 that is the refraction index of glass, and the air has a refraction index of 1.0, and thus when light is outwardly emitted from the substrate 210, the total reflection occurs. However, when linearity of light is improved before the light is outwardly emitted from the substrate 210, since most of the light travels toward a boundary between the substrate 210 and the outside at an incidence angle smaller than a critical angle, the total reflection may be reduced even though the light travels from a medium exhibiting low refraction to that exhibiting high refraction.

Meanwhile, when the light travels from the anode layer 220 to the low refraction layer 260, a significant difference in refraction index therebetween causes total reflection to frequently occur. In order to prevent this problem, when a plurality of fourth projections P4 are formed on a surface of the low refraction layer 260 in contact with the anode layer 220, an incidence angle of the light partially incident on the fourth projections P4 may be smaller than a critical angle, and the diffraction phenomenon of the light occurs on an irregular part, so that the total reflection is reduced.

Therefore, the low refraction layer 260 may be formed of a material exhibiting a different (lower or higher) refraction index than 1.5 that is a refraction index of glass. The material constituting the different refraction layer 260 includes, for example, $SiO_2$ exhibiting a refraction index of about 1.54.

A method of fabricating an OLED according to some embodiments of the present invention will be described in detail below with reference to FIGS. 5A to 5G.

Figure 5A:
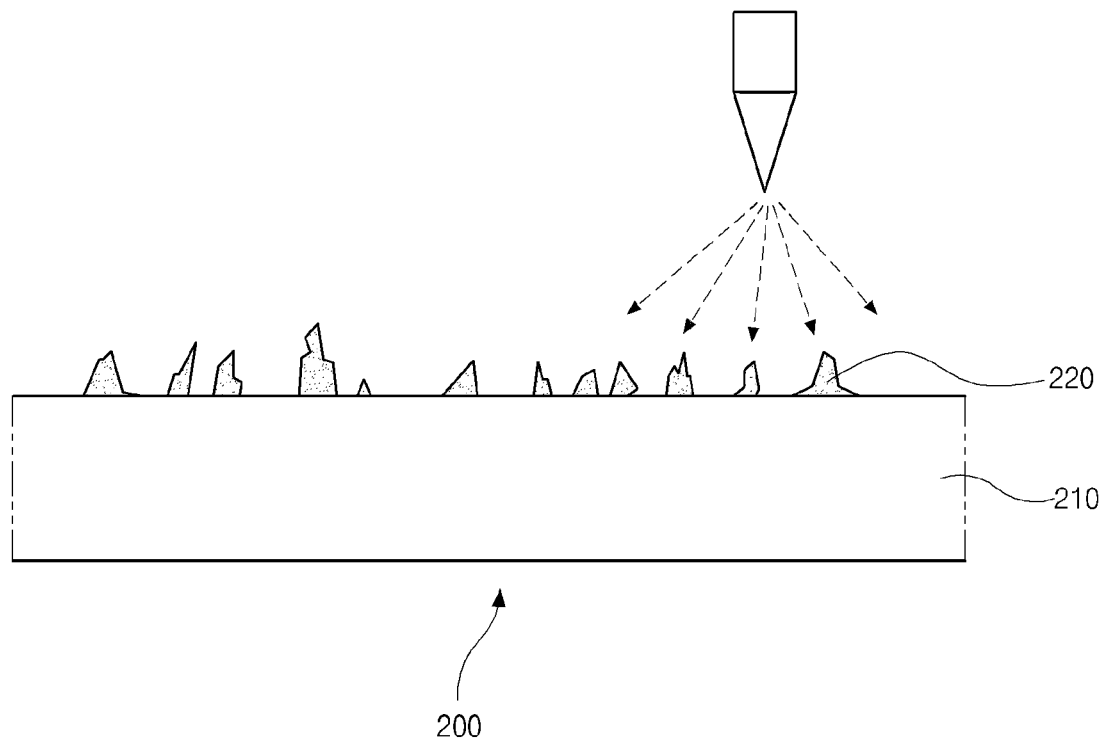
FIGS. 5A to 5E are cross-sectional views illustrating a method of fabricating an OLED according to some embodiments of the present invention.

As illustrated in FIG. 5A, first anode layers 220 may be formed on a substrate 210 using a sputtering method. In an initial step of film forming of a material constituting the first anode layers 220, the first anode layers 220 may be grown in a plurality of pillars spaced apart from each other as illustrated in the drawing. In the subsequent process, empty spaces between the pillars may be filled to be formed in the shape of a layer, and an upper region in the pillar shape becomes a first projection P1 of the first anode layer 220.

In forming the first projection P1, the temperature of the substrate is maintained similar to a melting point of a sputtering material to gradually lower the temperature, so that crystals may be fully generated. When a difference in temperature between the melting point and the substrate is great and the material rapidly hardens, the material may be solidified in an amorphous state before forming the crystals, so that a projection with a desired width cannot be formed. Therefore, a double projection structure is formed by adjusting the temperature of the substrate.

Figure 5B:
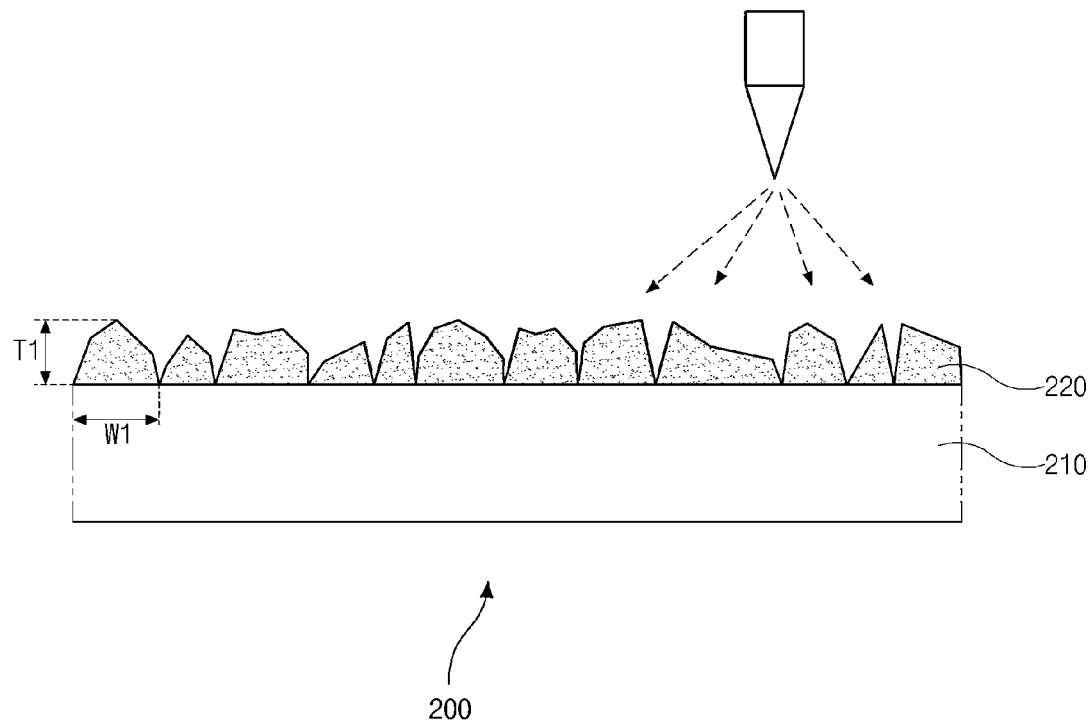

In FIG. 5B, the first anode layers 220 on which a plurality of projections P1 are formed are illustrated. The first anode layers 220 may be formed to have a thickness T1 from about 500 to about 2500 Å, from about 1000 to about 2500 Å, from about 1000 to about 2000 Å, from about 1500 to about 2000 Å, and the plurality of first projections P1 formed on the first anode layer 220 may be formed to a width W1 from about 1000 to about 5000 Å, from about 2000 to about 4000 Å, or from about 3000 to about 4000 Å. The first anode layer 220 may include tin oxide or zinc oxide.

While it is not illustrated in the drawing, an etching or laser process may be further employed after the sputtering process, and the first projection P1 may be elaborately handled to a desired size and shape.

The etching process is a process in which a dipping or spray process may be performed on a layer to be formed to expose the layer to an alkaline solution, so that its surface is etched. After performing the sputtering process, the surface of the first anode layer 220 may be exposed to an alkaline solution to further smooth the plurality of first projections P1. Also, the etching process may enable the formed projections to be smoothed, and new projections to be formed on the smooth surface on which no projection is formed.

The laser process includes radiating a laser in a specific wavelength absorbed by the layer to be formed to form projections. When the laser is radiated, the layer absorbing the laser generates heat, so that its surface is melted. At this time, when radiation of the laser is stopped, the temperature around the layer is maintained at a lower temperature than the melting point to form crystals, and the melted part is hardened again. When crystallization is performed while the layer is hardened, since its surface is hardened in the same shape as the crystal, the first projection P1 may be adjusted again in a similar manner to adjusting the size of crystals constituting a material.

The first anode layer 220 may include tin oxide or zinc oxide, and a laser wavelength absorbed by the materials is in a wavelength of a near infrared ray, which is about 1064 nm. While the melted part is hardened again after radiating a laser in the wavelength, the width W1 of the plurality of first projections P1 may be adjusted. The laser process may be possible after other layers are formed.

Like the etching process, in the laser process, the formed projections may be smoothed through recrystallization, and new projections may be formed on a smooth surface on which no projection is formed.

Figure 5C:
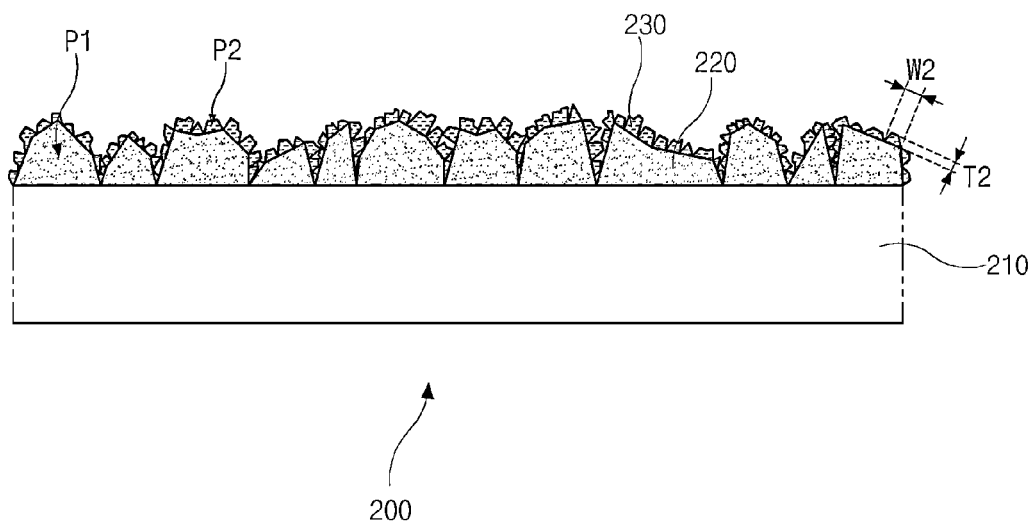

Next, as illustrated in FIG. 5C, a second anode layer 230 may be formed on the first anode layer 220. The second anode layer 230 may be formed by a sputtering method as well. The second anode layer 230 is formed to a thickness T2 from 5 to 250 Å, from 10 to 200 Å, from 50 to 150 Å, from 100 to 250 Å, or from 100 to 200 Å, and a plurality of second projections P2 formed on the second anode layer 230 may be formed to a width W2 from about 10 to 500 Å, from about 100 to 400 Å, from about 150 to 300 Å, or from about 200 to 300 Å. The second anode layer 230 may include a material whose growing crystals are smaller than the materials in the first anode layer 220. For example, the second anode layer 230 may include indium tin oxide and/or indium zinc oxide, and growing crystals are smaller than tin oxide or zinc oxide in the first anode layer 220, and thus the width W2 of the second projection P2 may be smaller than the width W1 of the first projection P1.

Further, tin oxide and zinc oxide are superior to indium tin oxide and/or indium zinc oxide in terms of transparency and price, and thus are good materials capable of improving brightness and reducing manufacturing costs. However, tin oxide and zinc oxide exhibit low work function, and thus have lower efficiency of providing holes to the organic emission layer 240. In order to overcome the problem with work function, the second anode layer 230 may include indium tin oxide and/or indium zinc oxide.

When the width, thickness and density of the projections are insufficiently adjusted using only the sputtering method in forming the second anode layer 230, the etching or laser process may be further employed after the sputtering process, so that the second projection P2 may be smoothed to a desired size and shape.

Figure 5D:
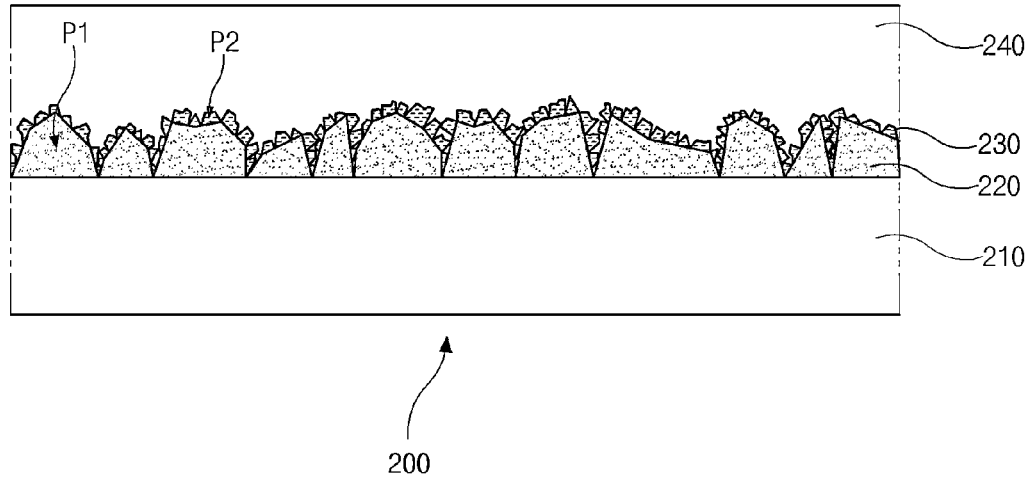

Afterwards, as illustrated in FIG. 5D, the organic emission layer 240 may be formed on the second anode layer 230. The organic emission layer 240 may be formed by a thermal evaporation method. The organic emission layer 240 is formed on the anode layers 220 and 230 from which a crack point is removed, and thus may not be damaged in or after the formation of the layer.

Figure 5E:
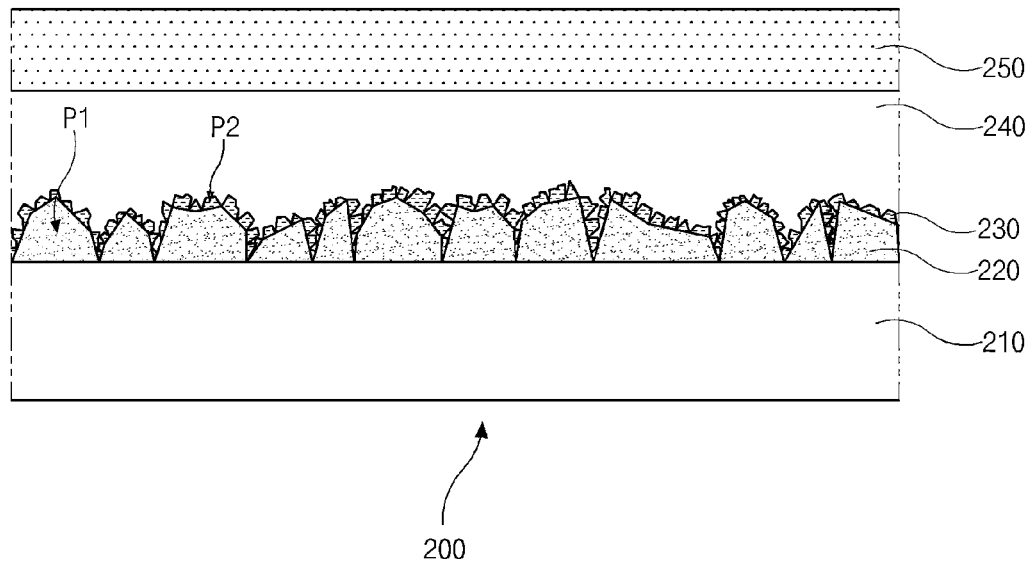

Then, as illustrated in FIG. 5E, a cathode layer 250 is formed on the organic emission layer 240. The cathode layer 250 may be formed by a sputtering method, and may formed of a metal (e.g. silver (Ag) or aluminum (Al)) exhibiting a high reflection index. The light emitted to a rear surface of the organic emission layer 240 is reflected from the cathode layer 250 to be emitted to the outside, so that brightness may be enhanced.

Figure 6:
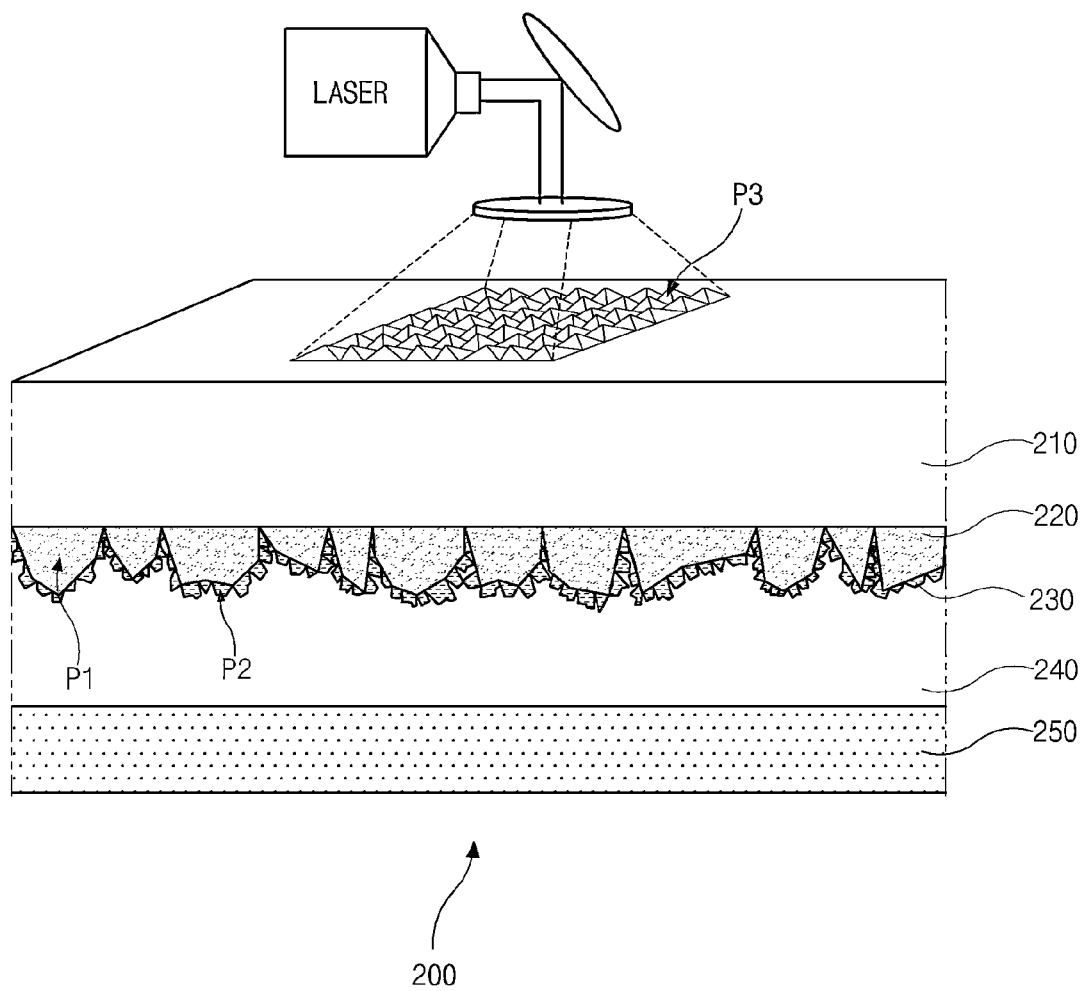
FIG. 6 is a cross-sectional view illustrating a method of fabricating an OLED according to additional embodiments of the present invention.

FIG. 6 is a cross-sectional view illustrating a method of fabricating an OLED according to further embodiments of the present invention, and is a view illustrating a method of fabricating only parts different from those described in the first embodiment.

As illustrated in FIG. 6, a plurality of third projections P3 may be formed on the substrate 210. The third projections P3 may be formed through the above-described etching process or laser process. It is illustrated in the drawing that the third projections P3 may be formed on the substrate 210 using a laser after the cathode layer 250 is formed. That is, the substrate 210 may be exposed to an alkaline solution to etch a surface of the substrate or a laser is radiated to melt the surface of the substrate 210, so that the third projections P3 are formed through recrystallization.

Figure 7:
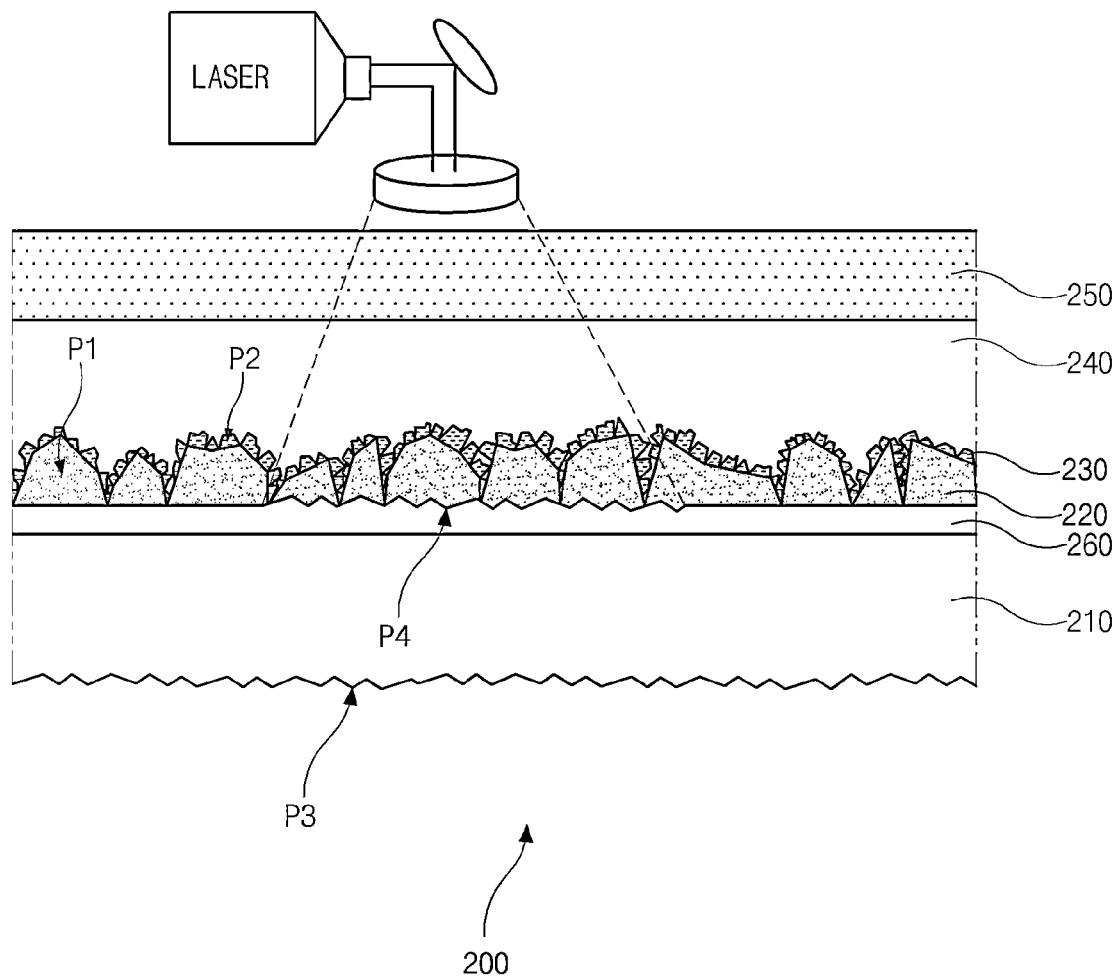
FIG. 7 is a cross-sectional view illustrating a method of fabricating an OLED according to yet additional embodiments of the present invention.

FIG. 7 is a cross-sectional view illustrating a method of fabricating an OLED according to yet further embodiments of the present invention, and is a view illustrating a method of fabricating only parts different from those described in the second embodiment.

As illustrated in FIG. 7, a plurality of fourth projections P4 may be formed on a surface of a low refraction layer 260 in contact with the substrate 210. It is illustrated in the drawing that the fourth projections P4 may be formed on the low refraction layer 260 using a laser after forming the cathode layer 250. While the etching process of the methods of forming the fourth projections P4 may be performed before forming the anode layers 220 and 230, the laser process may be performed regardless of time after the low refraction layer 260 is formed.

According to the present invention, anodes formed on a substrate have a double projection structure to improve light extraction efficiency.

Also, the anodes that are in contact with an organic emission layer employ a double projection structure to remove a crack point, so that the organic emission layer may be prevented from being damaged.

Further, according to the present invention, light extraction efficiency is enhanced, so that high brightness can be implemented with low power consumption.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. An organic light emitting display device (OLED), comprising:
   a substrate;
   a first anode layer disposed on the substrate and including a plurality of first projections;
   a second anode layer disposed on the first anode layer and including a plurality of second projections;
   an organic emission layer formed on the second anode layer; and
   a cathode layer formed on the organic emission layer.

2. The OLED according to claim 1, wherein the first and second anode layers are formed of different materials.

3. The OLED according to claim 1, wherein the first anode layer comprises tin oxide or zinc oxide, and the second anode layer comprises indium tin oxide or indium zinc oxide.

4. The OLED according to claim 1, wherein widths W1 and W2 of the first and the second projections, respectively, are different, and/or thickness T1 and T2 of the first and the second projections, respectively, are different.

5. The OLED according to claim 1, wherein the first anode layer has a thickness T1 from about 500 to about 2500 Å, the first projections has a width W1 from about 1000 to 5000 Å, the second anode layer has a thickness T2 from about 5 to about 250 Å, and the second projections as a width W2 from about 10 to about 500 Å.

6. The OLED according to claim 1, wherein a width W2 of the second projections are from about 2 to about 500 times smaller than a width W1 of the first projections.

7. The OLED according to claim 1, wherein the cathode layer comprises silver or aluminum.

8. The OLED according to claim 1, wherein the substrate includes a plurality of third projections.

9. The OLED according to claim 1, further comprising a low refraction layer disposed on the substrate, wherein the low refraction layer includes a plurality of fourth projections in contact with the first or second anode layer.

10. A method of fabricating an organic light emitting display device (OLED), comprising:
    forming a first anode layer including a plurality of first projections on a substrate;
    forming a second anode layer including a plurality of second projections on the first anode layer;
    forming an organic emission layer on the second anode layer; and
    forming a cathode layer on the organic emission layer.

11. The method according to claim 10, wherein the first and second anode layers are formed of different materials.

12. The method according to claim 10, wherein the first anode layer comprises tin oxide or zinc oxide, and the second anode layer comprises indium tin oxide and/or indium zinc oxide.

13. The method according to claim 10, wherein widths W1 and W2 of the first and the second projections, respectively, are different, and/or thickness T1 and T2 of the first and the second projections, respectively, are different.

14. The method according to claim 10, wherein the first anode layer has a thickness T1 from about 500 to about 2500 Å, the first projections has a width W1 from about 1000 to 5000 Å, the second anode layer has a thickness T2 from about 5 to about 250 Å, and the second projections as a width W2 from about 10 to about 500 Å.

15. The method according to claim 10, wherein a width W2 of the second projections are from about 2 to about 500 times smaller than a width W1 of the first projections.

16. The method according to claim 10, wherein the substrate includes a plurality of third projections.

17. The method according to claim 10, further comprising forming a low refraction layer disposed on the substrate, wherein the low refraction layer includes a plurality of fourth projections in contact with the first or second anode layer.

18. The method according to claim 10, wherein the first anode layer is formed by a sputtering method comprising growing the first anode layer in a plurality of pillars spaced between the pillars, and filling the space and an upper region of the pillar.

19. The method according to claim 18, wherein the method further comprises etching or laser process to form the plurality of the third projections.

20. The method according to claim 10, wherein in forming the first projections, the temperature of the substrate is maintained similar to a melting point of a sputtering material to gradually lower the temperature.

* * * * *